United States Patent [19]
Flint et al.

[11] Patent Number: 4,730,666
[45] Date of Patent: Mar. 15, 1988

[54] FLEXIBLE FINNED HEAT EXCHANGER

[75] Inventors: Ephraim B. Flint, Garrison; Kurt R. Grebe, Beacon; Peter A. Gruber, Mohegan Lake; Arthur R. Zingher, White Plains, all of N.Y.

[73] Assignee: International Business Machines Corporation, Armonk, N.Y.

[21] Appl. No.: 858,318

[22] Filed: Apr. 30, 1986

[51] Int. Cl.$^4$ .......................... F28F 7/00; H01R 13/00
[52] U.S. Cl. ....................................... 165/80.4; 165/46
[58] Field of Search ....................... 165/46, 80 C, 80.4

[56] References Cited

U.S. PATENT DOCUMENTS

| | | | |
|---|---|---|---|
| 3,860,949 | 1/1975 | Stoeckert et al. | 357/71 X |
| 3,864,728 | 2/1975 | Peltz et al. | 357/71 |
| 3,877,062 | 4/1975 | Murrmann | 357/71 X |
| 4,069,498 | 1/1978 | Joshi | 165/80.2 X |
| 4,072,188 | 2/1978 | Wilson et al. | 165/80 |
| 4,092,697 | 5/1978 | Spaight | 174/16 HS X |
| 4,095,253 | 6/1978 | Yoshimura et al. | 174/16 HS X |
| 4,109,707 | 8/1978 | Wilson et al. | 165/46 |
| 4,132,856 | 1/1979 | Hutchison et al. | 174/16 HS X |
| 4,151,547 | 4/1979 | Rhoades | 165/80 |
| 4,222,090 | 9/1980 | Jaffe | 165/80.3 X |
| 4,254,431 | 3/1981 | Babuka et al. | 165/80 C X |
| 4,263,965 | 4/1981 | Mausuria et al. | 165/80.4 |
| 4,341,432 | 7/1982 | Cutchaw | 165/80.4 X |
| 4,381,032 | 4/1983 | Cutchaw | 165/46 |
| 4,451,540 | 5/1984 | Baird et al. | 174/52 FP X |
| 4,574,876 | 3/1986 | Aid | 165/46 |

FOREIGN PATENT DOCUMENTS 804297 11/1958 United Kingdom .............. 165/80 C

OTHER PUBLICATIONS

Antonetti, V. W., Chu, R. C., Moran, K. P. and Simons, R. E. "Compliant Cold Plate Cooling Scheme" IBM Technical Disclosure Bulletin, vol. 21, No. 6, Nov. 1978, p. 2431.
Dombrowska R. J. and Patch, P.O., "Conduction Cooled Heat Plate for Modular Circuit Package" IBM Technical Disclosure Bulletin, vol. 13, No. 2, Jul. 1970, p. 442.
B. Tuckerman & Pease "High Performance Heat Sinking for VSLI" IEEE Electron Devices Letters, vol. EDL-2, No. 5, May, 1981 (pp. 126–129), particularly pp. 126,128.
J. Layman "Special Report–Super Computers Demand Innovation in Packaging and Cooling", Electronics, Sep. 22, 1982 (pp. 136–143), particularly p. 142.
D. Buhanan, "CML and Flip Tab Join Forces in the DPS 88's Micropackages", Electronics, Nov. 3, 1982 (pp. 93–99), particularly p. 98,99.

*Primary Examiner*—Douglas Hart
*Attorney, Agent, or Firm*—Perman & Green

[57] ABSTRACT

A heat exchanger for cooling an array of electric circuit chips disposed on a common substrate is formed as a flexible sheet of thermally conducting material with upstanding fins for transference of heat from the chips to a coolant flowing through the fins. The sheet may be provided with corrugations set between sites of the chips for improved flexibility to accommodate individual orientations of the chips. The sheet is sufficiently large to cover an array of chips and is secured adheringly, as by use of a thermally conductive grease, to the chips. The sheet hermetically seals the chips from contamination by the coolant. The heat exchanger may be fabricated of copper with a nickel coating, wherein the copper provides the heat conduction and the nickel protects the copper from a corrosive coolant such as water. The finned sheet may be efficiently fabricated by processes analogous to those used to make printed circuits. In one embodiment of the heat exchanger, the fin thickness, the fin spacing and the sheet thickness are all approximately equal, a typical sheet thickness being approximately two mils.

17 Claims, 17 Drawing Figures

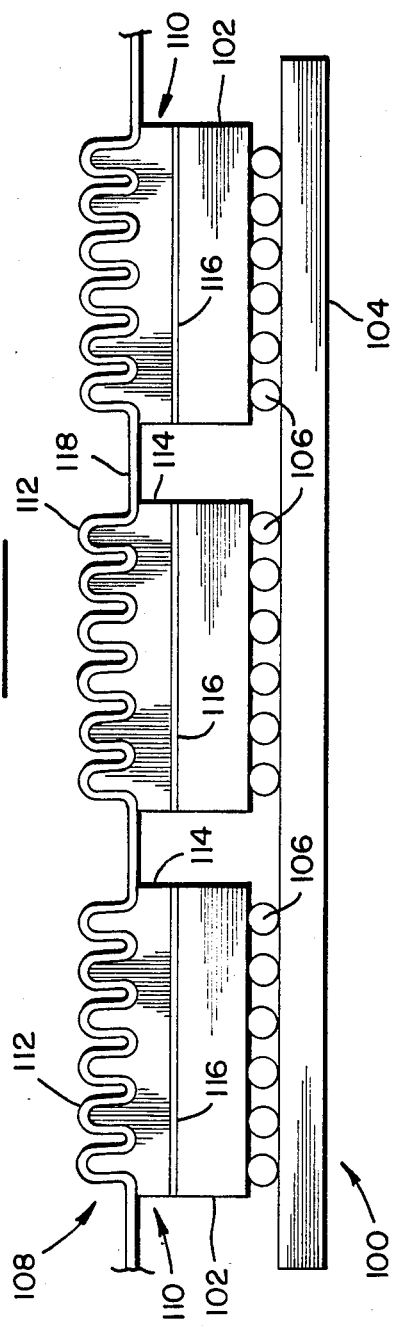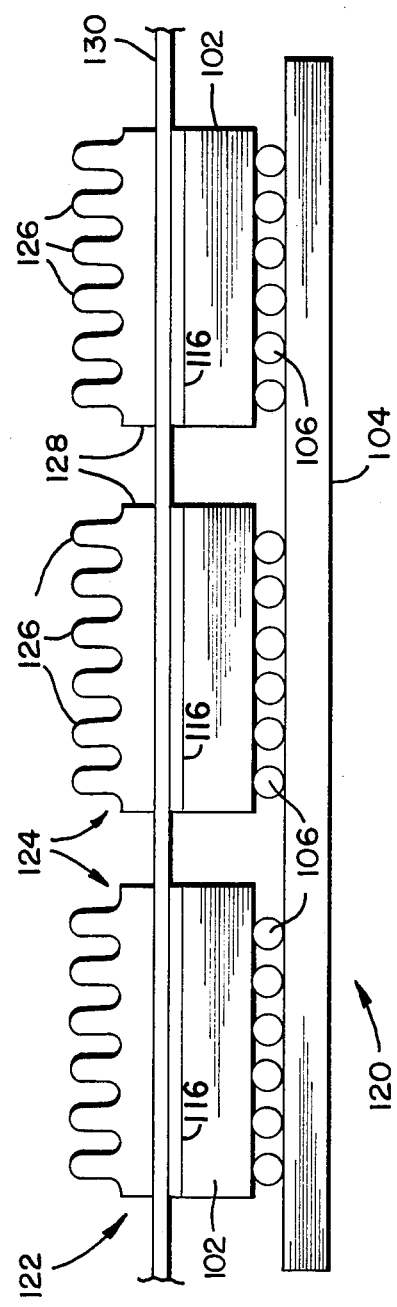

FLEXIBLE FINNED HEAT EXCHANGER

BACKGROUND OF THE INVENTION

This invention relates to a heat exchanger for transfer of heat from an array of electronic circuit chips and, more particularly, to a flexible sheet having cooling fins thereon to be placed directly on the array of chips.

Arrays of electronic circuit chips are interconnected to provide vast electronic circuits. Such circuits may be employed in computers and other electronic systems utilizing very large numbers of electronic circuit components. In particular, it is noted that the many transistors and other circuit components present within a circuit chip dissipate heat in response to activation with current from an electric power supply. In order for the circuits to function properly, the heat must be removed to maintain proper operating temperature for the circuits.

One form of cooling which has been proposed is the use of a metal plate held against circuit chips by springs, as is disclosed by Cutchaw (U.S. Pat. No. 4,381,032). Another form of heat exchanger for cooling electronic circuits provides for passages within which liquid coolant is circulated, the coolant contacting a flexible wall which presses against the circuitry to be cooled as shown in Wilson et al, U.S. Pat. No. 4,072,188. Another form of heat exchanger employs coated metallic dendrites which are held by springs against a circuit chip as disclosed in Babuka et al, U.S. Pat. No. 4,254,431. Yet another form of heat exchanger employs a pillow structure formed of film and filled with a thermal liquid material for extracting heat from an electric circuit, as is disclosed in Spaight, U.S. Pat. No. 4,092,697. Also a malleable dimpled wafer is deformed by pressure between a heat source such as an electronic circuit and a heat sink, as is disclosed in Rhoades et al, U.S. Pat. No. 4,151,547. A theoretical discussion of cooling considerations is presented in an article in the IEEE Electron Devices Letters, "High Performance Heat Sinking For VLSI" by D. B. Tuckerman and R. F. W. Pease, Vol. EDL-2, No. 5, May 1981.

A problem arises in that the foregoing heat-exchanger structures are either complex, or require complex manufacturing procedures in assembling the heat exchanger with the electric circuits to be cooled. In view of the large number of circuit chips to be employed in an electronic system, and the small size of the chips which are on the order of approximately a few millimeters square, any reduction in the complexity of the heat exchanger and in the assembly procedures can significantly reduce manufacturing costs, and may even permit the use of still higher power dissipation in the electric circuits. Presently available heat exchangers do not provide these advantages.

SUMMARY OF THE INVENTION

The aforementioned aspects and other features of the invention are attained by a construction of heat exchanger which, in accordance with the invention, is formed as a flexible sheet of thermally conductive material, and is provided with a set of fins of thermally conductive material upstanding upon the flexible sheet. The sheet is large enough to encompass an array of circuit chips disposed on a common substrate and can completely blanket the array of chips. The sheet can be attached to the substrate, by use of suitable adhesives, so as to hermetically seal the chips against any contamination by a fluid coolant. In addition, the sheet may be provided with corrugations at locations between the sites of the chips so as to provide for greater flexibility and the capacity for fully aligning each portion of the sheet with the corresponding surface of a chip.

The fins are arranged in the direction of coolant flow, thereby to transfer more effectively the heat of the chip to the coolant. In one embodiment of the invention, the fins are arranged in a staggered array to promote the flow of coolant and contact between the coolant and the fins. In a further embodiment of the invention, the thickness of the fins is approximately equal to the spacing between fins which, in turn, is approximately equal to the thickness of the sheet, typically two mils.

The material used in the construction of the heat exchanger is dependent on the nature of the coolant. For example, in the case of air used as the fluid coolant, the sheet and fins of the heat exchanger may be constructed of copper which provides for good thermal conductivity and, in addition, is flexible at sheet thicknesses in the range of 0.5–5 mils. In the case of a more corrosive coolant, such as water, the copper of the fins is coated with a metal such as nickel which prevents corrosion of the heat exchanger by the water. Chromium or its alloys may also be used to coat the heat exchanger.

Good thermal conductivity between the sheet and the underlying circuit chip is attained by use of a thermally conducting grease. In addition, if desired, a spring loaded plate may be applied against the tops of the fins to urge the heat exchanger structure against the array of chips, thereby to promote good thermal conductivity between the heat exchanger and the chips.

Important features of the invention are the establishment of fine groove forced convection cooling, a flexible hermetically sealing sheet, and a fabrication of the heat exchanger by photolithographic techniques as are employed in the production of printed circuits. In the fabrication of the fins and grooves, the thickness of the fins and the width of the grooves are both equal approximately to 50 microns, such dimensions being well suited for the transference of heat from the fins to a liquid coolant such as water. It is noted that in the construction of circuit assemblies involving multiple chips and fin assemblies coupled thereto, that there are stresses associated with the attachment of a fin assembly to a chip. Also, the chips may be mounted to a substrate by means of fragile connections in the form of solder balls, which balls may be broken by excessive stress upon a chip. The flexible sheet, in addition to protecting the circuit chips from contaminants by hermetic sealing, also relieves the foregoing stresses between chips so as to protect the connections between the chips and the substrate. The convenience of manufacture of the heat exchanger by photolithographic technology is attainable because of the small fin and groove dimensions, noted above, which dimensions are suitable for masking and additive plating to form the cooling structure of the fins and grooves.

BRIEF DESCRIPTION OF THE DRAWINGS

The aforementioned aspects and other features of the invention are explained in the following description, taken in connection with the accompanying drawing wherein:

FIG. 9 shows a further construction of the invention wherein a fin and base assembly is secured beneath a flexible sheet;

FIG. 10 shows an alternative construction of the invention wherein a fin and base assembly is secured on top of a flexible sheet;

DETAILED DESCRIPTION

Figure 1:
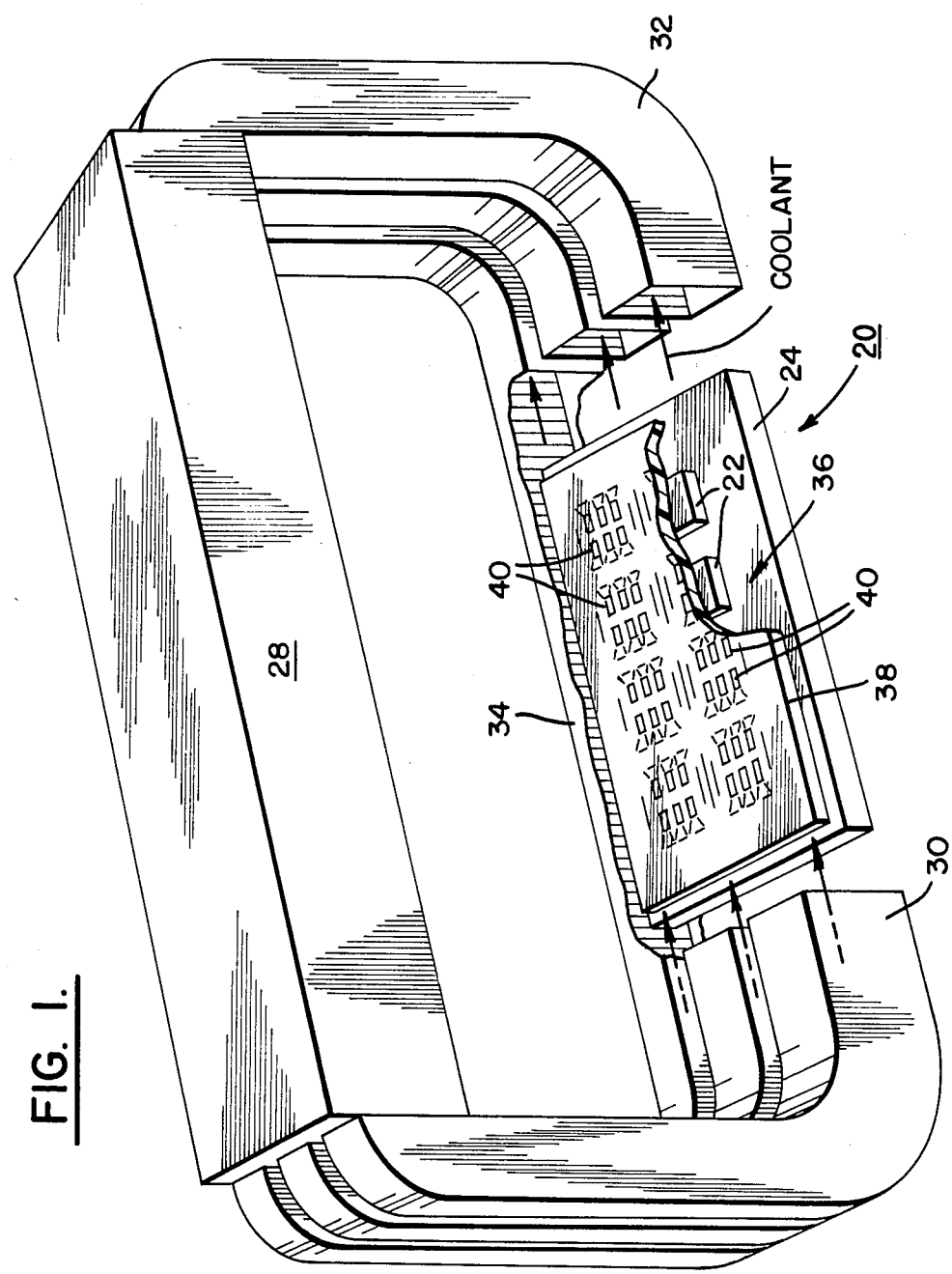
FIG. 1 is an isometric view, partially stylized, of a heat exchanger embodying the invention being used for cooling an array of circuit chips, the figure also showing a manifold for conducting coolant to fins of the heat exchanger.
Figure 2:
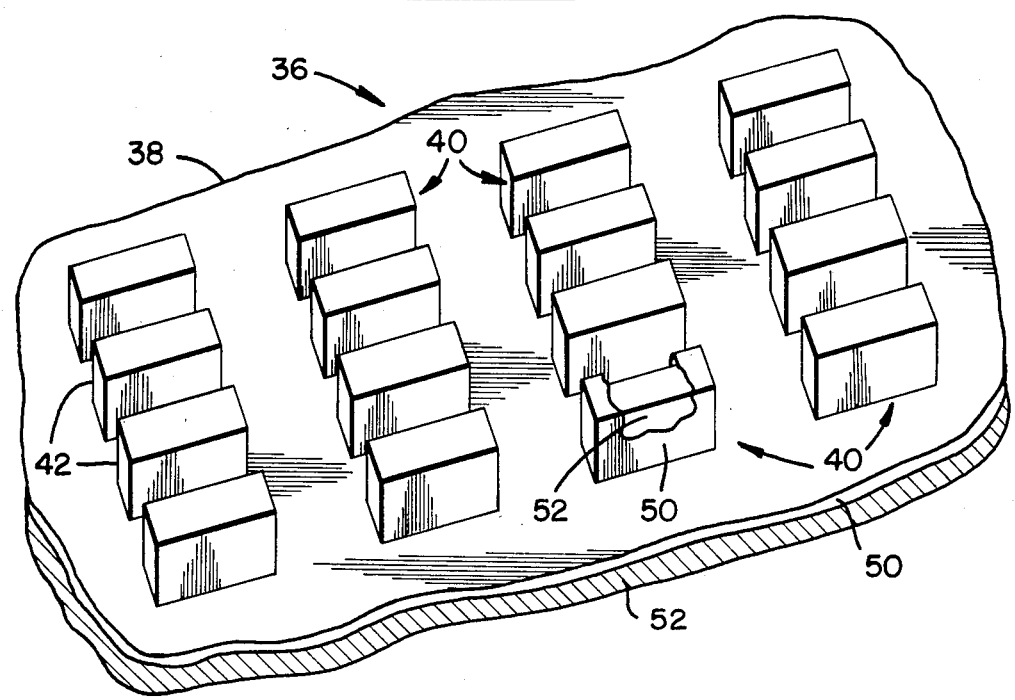
FIG. 2 is an enlarged fragmentary view of a portion of the heat exchanger of the invention.
Figure 3:
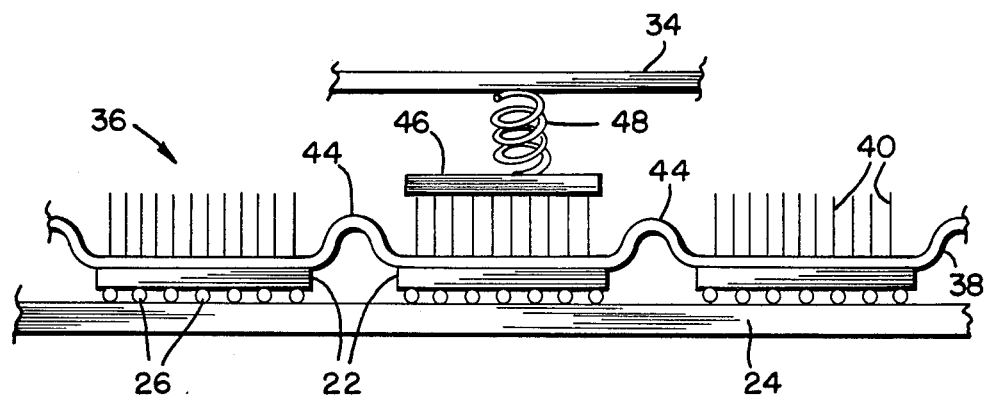
FIG. 3 is a side view, partially schematic, of the heat exchanger of the invention, the view showing corrugations in a sheet of the heat exchanger for improved flexibility.

With reference to FIGS. 1–3, an electronic system 20 is formed as an array of circuit chips 22 disposed on a common substrate 24. Electrical connections between the chips 22 are accomplished by well-known conductors (not shown) within the substrate 24 and a set of soft metal solder ball connections 26 (known as C4's) located between terminals of the chips 22 and the conductors of the substrate 24. Heat generated within the chips 22 by electric currents flowing within the circuits of the chips 22 is removed by means of a fluid coolant provided by a chiller 28 and conveyed therefrom to the chips 22 by a supply conduit 30 and a return conduit 32. A duct 34, partially shown in FIG. 1, guides the coolant past the chips 22 between the conduits 30 and 32. The chips 22 of FIG. 1 represent only a portion of the system 20, additional chips (not shown on the Fig.) also being provided with supply and return conduits (not shown) which conduits in combination with the conduits 30 and 32 constitute a manifold for conducting coolant between the chiller 28 and the electronic system 20.

In accordance with the invention, the cooling of the chips 22 is accomplished more efficiently by the use of a heat exchanger 36 comprising a flexible sheet 38 of thermally conductive material with fins 40 of thermally conductive material extending away from the sheet 38. In FIG. 1, the sheet 38 is shown covering the chips 22, with a part of the sheet 38 being cut away to show partially two of the chips 22. Due to the flexibility of the sheet 38, the heat exchanger 36 covers the chips 22 and the substrate 24 in a manner of a blanket. The flexibility of the sheet 38 provides for the relief of stress exerted on the chips 22, otherwise due to the cooling system. It is noted that the foregoing solder ball connections 26 have a diameter of only 5 mils, and are susceptible to fracture. The foregoing stresses cannot be transmitted via the sheet 38 to another chip because of the flexing action of the sheet 38. This protects the connections 26.

A suitable thermally conductive material for construction of the heat exchanger 36 is a flexible metal, such as copper. The configuration of the fins 40 upstanding from the metal sheet may be referred to as a "metal velvet" because one side of the sheet has a fine fin structure while the opposite side of the sheet is smooth. While the heat exchanger 36 may have relatively large fins for air cooling, the "velvet" effect of the smaller fins for water cooling is advantageous because the smaller fin size, fin thickness and groove width of 50 microns, enhances the transfer of heat from the fins to water.

As shown in FIG. 2, the fins 40 are oriented in a regular array to form grooves 42 between the fins 40 which are aligned along the direction of coolant flow so as to guide the coolant among the fins 40. The fins 40 are located on the sheet 38 only at those locations corresponding to sites of the chips 22. At the locations on the sheet 38 corresponding to spaces between the chips 22, as shown in FIG. 3, it is advantageous to construct a corrugation 44 within the sheet 38 to increase the flexibility thereof to insure a better conformal fit of the underside of the sheet 38 to the top surfaces of the chips 22. In particular, is noted that the flexibility of the sheet 38 permits the heat exchanger 36 to conform to the individual orientations of the surfaces of the chips 22 for enhanced conduction of heat from each chip 22 to the coolant.

If desired, as shown in FIG. 3, a pressure plate 46 may be applied to the top ends of the fins 40 and pressed against the heat exchanger 36 by a spring 48 secured to the ducts 34 of the cooling manifold. The pressure exerted by the spring 48 is sufficiently small so as to preclude any bending of the fins 40, but is sufficiently large to promote thermal contact between the sheet 38 and the top surface of a chip 22, such as the middle chip depicted in FIG. 3 with the pressure plate 46.

Figure 4:
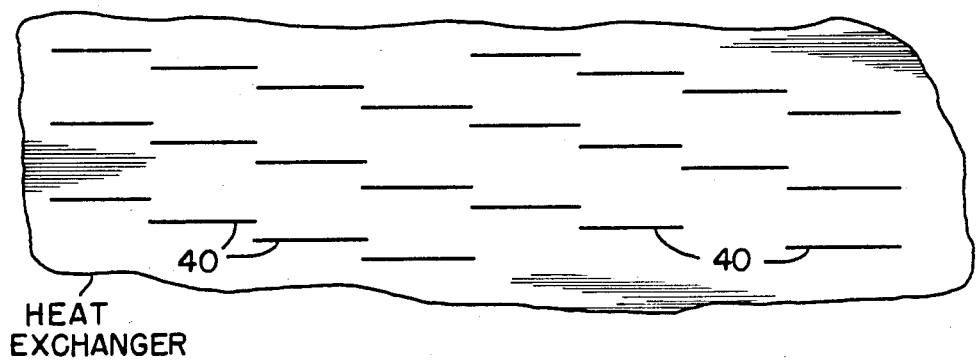
FIG. 4 is a diagrammatic view of a staggered arrangement of fins in an alternative embodiment of the heat exchanger of FIGS. 1–3.

With respect to the arrangement of the fins 40, the fins 40 may be arranged in rows and columns, as shown in FIG. 2, or alternatively, may be located in a staggered array as shown diagrammatically in FIG. 4. In both cases, the orientation of the fins 40 follows the lines of coolant flow so as to provide for good conduction of heat from the fins 40 into the coolant.

In the embodiment of FIG. 2, the spacing between the fins 40 is approximately equal to the thickness of an individual fin, thereby to minimize the build up of any thermal boundary layer within the coolant, as the coolant flows past the fins 40.

As shown In FIG. 2, the material of the heat exchanger may be coated with a coating 50 to protect the material from any corrosive effects of the coolant. The coating 50 is not required with non-corrosive coolants. For example, in the case where the coolant is air, a suitable material for the heat exchanger 36 is copper. Because air is not corrosive, an anodized coating or even no coating may be sufficient. However, in the case where the coolant is water, the copper should be coated with a coating 50 of nickel to prevent corrosion of the copper by the water. In FIG. 2, a portion of one of the fins 40 is partially cut away to show the coating 50 upon a base material 52 of copper. Also, the base material 52 and the nickel coating 50 may be seen in the sectioned portion of the sheet 38. Another suitable material for construction of the heat exchanger 36 is stainless steel. While the stainless steel is not as good a thermal conductor as copper, it is resistant to corrosive coolants, and may be used without a coating.

During the emplacement of the sheet 38 upon the top surfaces of the chips 22, it is preferable to employ a low-temperature soft metal alloy solder between the chip 22 and the sheet 38 for best heat conductivity. In the event that a lesser thermal conductivity is adequate, then a thin layer of other thermally conductive material may be placed between the chip 22 and the sheet 38, suitable material being a well-known grease or oil with zinc oxide. Other suitable materials include a soft silicone elastomer which may include thermally conductive particles such as silicon carbide.

The spacing and sizes of the fins 40 is selected in accordance with the particular coolant to be employed. For example, in the case of a fluorocarbon coolant, the fins 40 can extend away from the sheet 38 a distance of almost one inch, and may be spaced apart with a spacing of one-eighth inch. On the other hand, in the case of a water coolant, the fins may be spaced apart by two mils, and may have a thickness of two mils, the individual fin extending along the direction of coolant flow for a distance of twelve mils.

A particular advantage in the use of the heat exchanger 36 of the invention is the fact that it can be placed on a relatively large array of chips 22, for example an array of 100 chips, without the requirement for any precise dimensional alignment, due to the flexibility of the heat exchanger 36. An additional feature is attained by adhesively securing the perimeter of the sheet 38 to the substrate 24, thereby to hermetically seal all of the chips 22 from the coolant. The thickness of the metal sheet 38 is selected in accordance with the specific material employed in the construction of the heat exchanger 36, a thickness in the range of 1–10 mils being suitable for copper. In the case of square chips measuring 4.5 millimeters on a side, and being arranged with a pitch of eight millimeters, a thickness on the order of 2–3 mils of copper provides good thermal conduction in the fins 40. Between the fin arrays, the Cu should be absent, and the nickel overcoat alone should form a flexible sheet. In the positioning of the fins 40 at the site of a chip 22, typically 50 of the fins are located at the site of one chip 22.

It is noted that, in the construction of the electronic system 20, the chips 22 may be placed on a substrate in the form of a ceramic tile having a size of typically four inches by four inches. For such application, the sheet 38 is made sufficiently large to cover the entire tile, thus greatly facilitating the manufacturing process for construction of the system 20. It is further noted that since both the substrate 24 and the chips 22 (typically fabricated of silicon) are rigid, it is advantageous to employ a heat exchanger which is so constructed as to avoid introduction of stresses and strains between the chips and the substrate so as to avoid cracking the solder ball connections 26. The heat exchanger 36 of the invention does not apply stresses by virtue of its flexible construction.

The heat exchanger is most readily fabricated in a manner analogous to the processes used to fabricate printed circuits. Start with a smooth aluminum mandrel, shaped for the corrugations. Apply a mask, and selectively plate copper fins at each chip location. Overcoat these fins and mandrel by electroless deposition of a thin layer of amorphous nickel. Each away the mandrel with an alkali solution. Thus over each chip are Cu fins covered with a layer of nickel. Between the chips is a thin layer of nickel.

Figure 5:
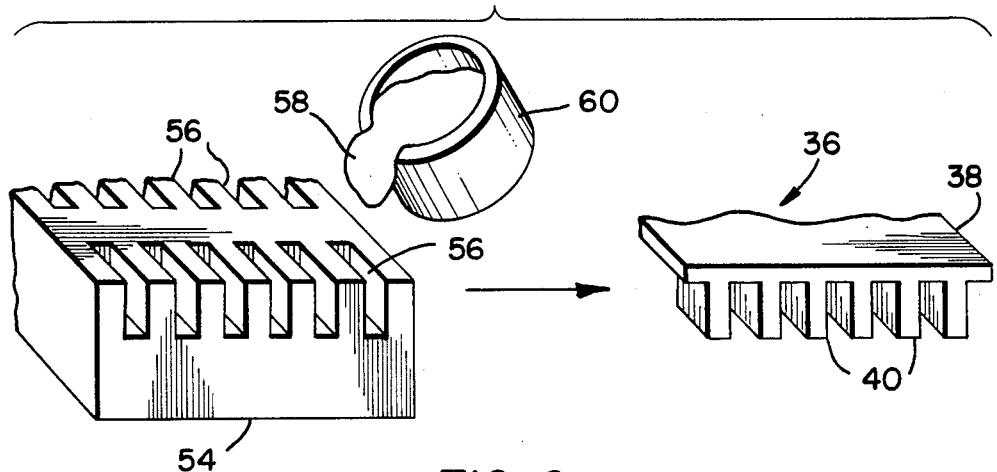
FIG. 5 shows one method of manufacture involving the casting of the metal heat exchanger in a mold.
Figure 6:
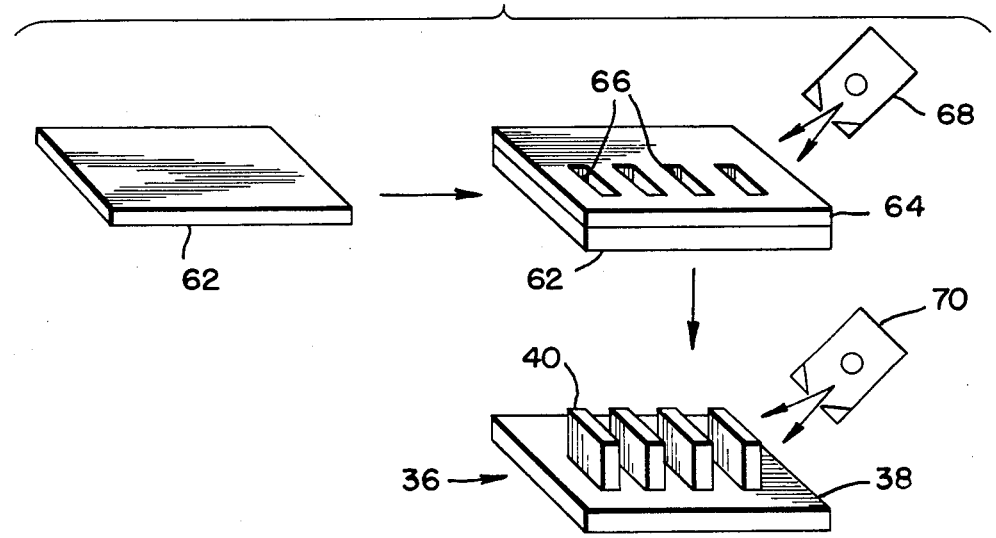
FIG. 6 is an alternative method of manufacture involving masking and deposition of the metal material.

In an alternative process, the heat exchanger 36 is readily manufactured by the processes portrayed in FIGS. 5 and 6. In FIG. 5, a mold 54 is provided with voids 56 having the shape of a fin 40. The heat exchanger 36 is cast by pouring molten metal 58 from a ladle 60 into the mold 54. Thereafter, the mold is cooled to solidify the metal. Upon removal of the mold from the metal, there is attained the heat exchanger 36 with integrally formed fins 40 upon the sheet 38. Only a portion of the mold 54 is shown to facilitate the description. However, it is to be understood that a larger mold would include voids for forming the corrugations 44 in a large sheet of the heat exchanger. Thereby, the entire heat exchanger 36 can be formed in a single manufacturing process.

In another alternative process, in FIG. 6, the manufacturing process begins with the preparation of a sheet 62 of thermally conducting material such as copper. A mask 64 is developed upon the upper surface of the sheet 62, the mask 64 being provided with voids 66 having the shape of a fin 40. Thereupon, metal, such as copper, is provided by a source 68 and deposited by chemical vapor deposition to build up fins 40 within the voids 66 of the mask 64. Thereupon, the mask 64 is removed, by conventional means, and a further source 70 is employed for depositing a coating, such as a nickel coating upon the completed assembly to provide the coated sheet 38 and fins 40 of the heat exchanger 36. Corrugations may be placed within the sheet 38 by a mechanical process such as swagging employing a preformed anvil, or similar mechanical form (not shown) to form the corrugations. Here too, a heat exchanger 36 can be fabricated in a sufficiently large size to cover a relatively large array of the chips 22.

Figure 7:
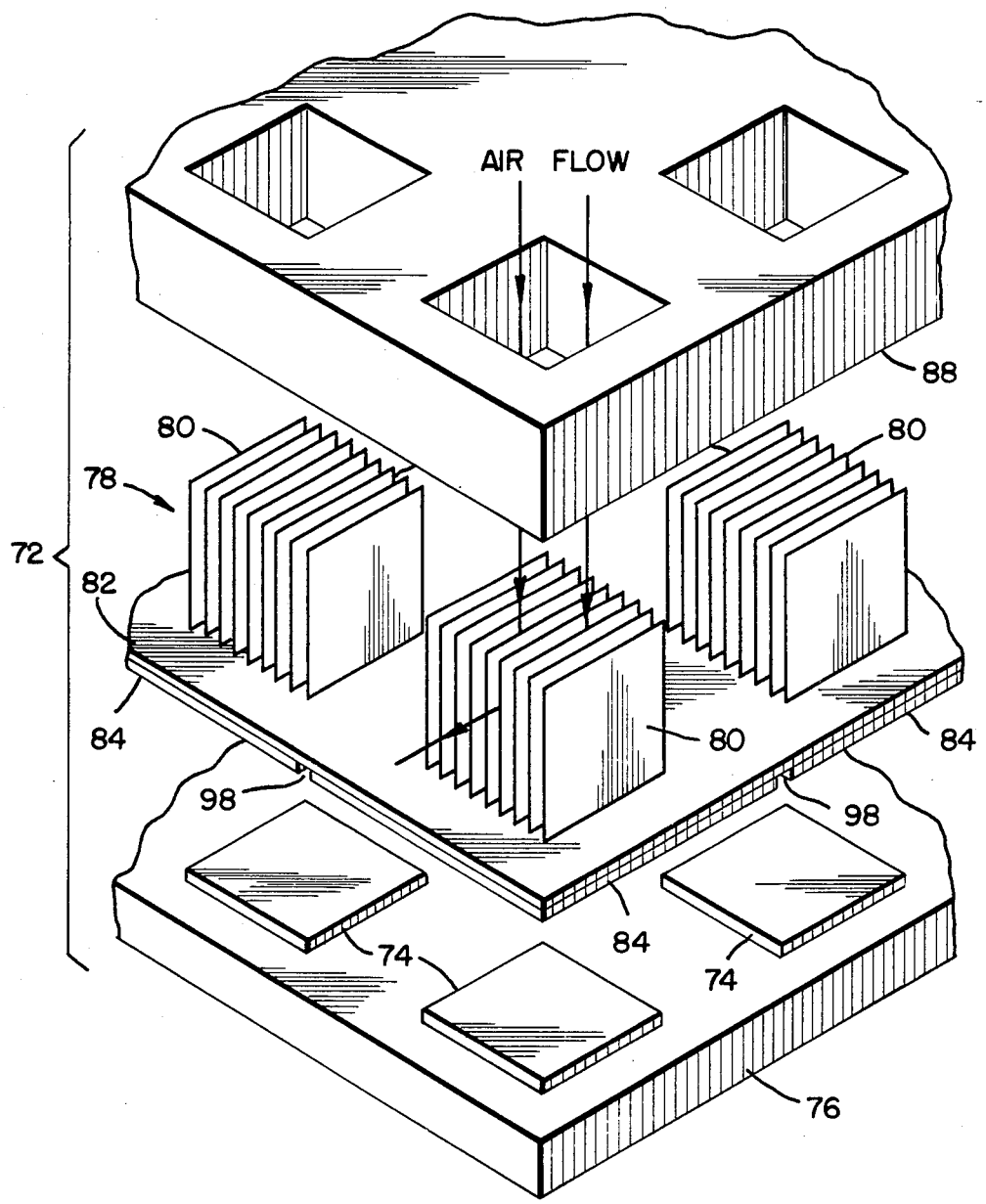
FIG. 7 is an exploded view of an alternative embodiment of the invention wherein pads are placed at the base of cooling fins.
Figure 8:
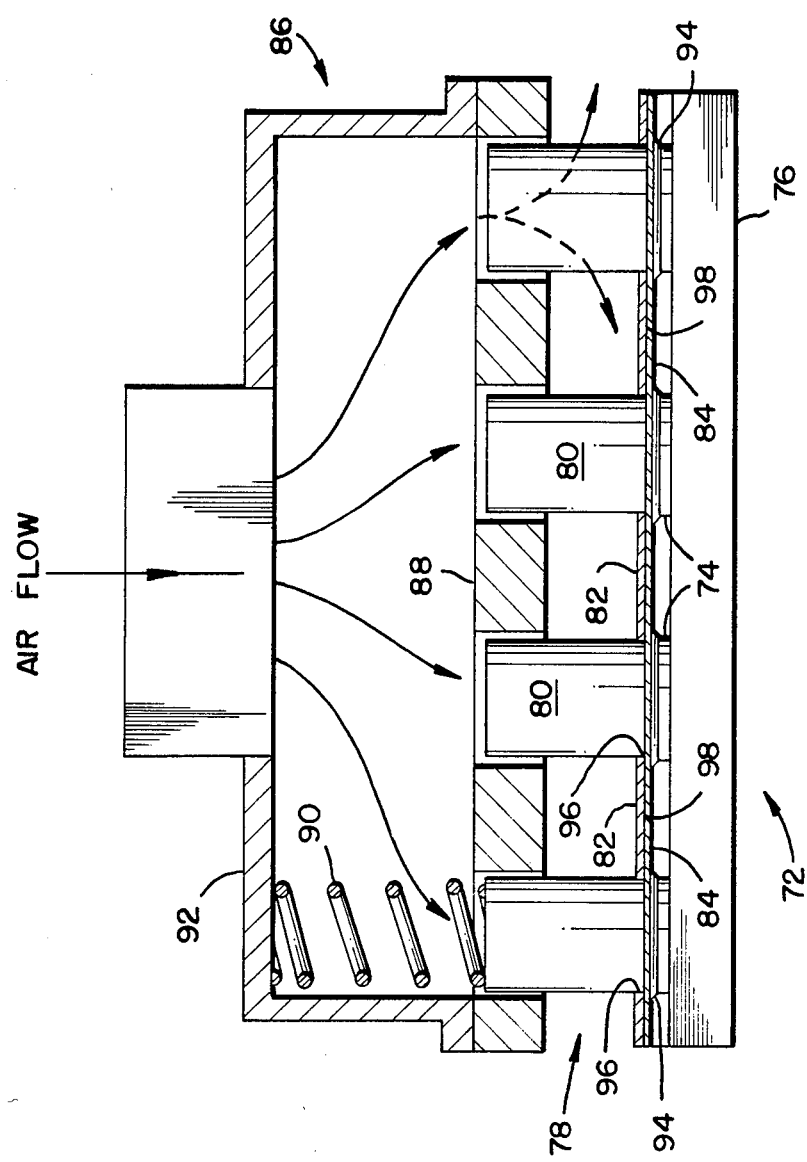
FIG. 8 is an elevation sectional view of the embodiment of FIG. 7.

FIGS. 7–8 show an electronic system 72, similar to the system 20 (FIG. 1) formed as an array of circuit chips 74 disposed on a common substrate 76. Cooling of the chips 74 is accomplished by a heat exchanger 78 constructed in accordance with a further embodiment of the invention wherein separate sets of cooling fins 80 are connected to a flexible sheet 82 with the aid of semi-rigid pads 84 formed of a thermally conductive material such as copper. The fins 80 are formed of copper to provide good conduction of heat from the chips 74 to streams of cooling air, indicated by arrows. The sheet 82 is formed of an electrically insulating plastic material such as a polycarbonate marketed under the name of "Kapton". The cooling air is conducted via a conduit 86 (FIG. 8) and guided via a plenum 88 to individual sets of the fins 80. Springs 90 (only one of which is shown in FIG. 8) are located between the respective sets of fins 80 and a wall 92 of the conduit 86 for pressing the pads 84 against the corresponding chips 74 to secure good thermal contact between the pads 84 and the chips 74. A layer 94 of a thermally conductive grease is disposed between each pad 84 and its corresponding chip 74 to attain still further thermal conductivity between the chips 74 and the pads 84.

This embodiment of the invention provides for a rigid connection between the fins 80 and the pads 84, the rigid connection allowing for a much greater height to the fins 80 than is practicable for the fins 40 of FIG. 3.

The extra height is particularly advantageous for the case of air cooling wherein a larger contact region, between fin and coolant, should be employed than in the case of liquid coolant. The heat exchanger 78 may be constructed, by way of example, by forming a laminate of copper sheet and the plastic sheet 82, positioning the fins 80 in contact with the copper sheet via apertures 96 (FIG. 8) in the sheet 82, and securing the fins 80 to the copper sheet as by low temperature soldering, 150 degrees Celsius. The soldering is done at a temperature which is sufficiently low so as not to damage the plastic material of the sheet 82. Thereafter, the copper sheet is etched to form troughs 98 which define the individual pads 84 and electrically insulate the pads 84 from each other.

By way of alternative mode of construction, an array of assemblies of pads 84 with their respective set of fins 80 may be formed by conventional means, and then the sets of fins 80 are passed through the apertures 96 in the plastic sheet 82. Thereafter, the pads 84 are bonded to the sheet 82 to form the heat exchanger 78. The flexibility of the sheet 82 allows each of the pads 84 to lie upon the surface of the corresponding chip 74 independently of chip height and orientation relative to the substrate 76. Also, the sheet 82 pneumatically seals the chips 74 in the same fashion as has been described above with respect to the embodiment of FIG. 1.

FIG. 9 shows a simplified view of an electronic system 100 comprising a set of electronic circuit chips 102 disposed on a common substrate 104 containing electrical conductors (not shown) for making electrical connections among the circuits of the chips 102. A set of C4 solder balls serve as connections 106 between terminals of the chip circuits and the conductors of the substrate 104. The system 100 includes a heat exchanger 108 constructed in accordance with a further embodiment of the invention and comprising a set of fin assemblies 110 each of which is formed of a set of fins 112 and a base 114 which supports the fins 112. Each of the fin assemblies 110 rests upon a corresponding one of the chips 102, and is thermally coupled thereto by means of a layer 116 of thermally conductive grease or soft solder or other highly thermally conducting interfaces. A flexible sheet 118 of thermally conductive material, such as amorphous nickel, is deposited upon the fin array assemblies 110 so as to form intimate thermal contact therewith. Each fin assembly 110 is formed of a thermally conductive material such as copper or silicon.

In FIG. 10, there is shown an electronic system 120 which, like the system 100 of FIG. 9, also comprises a substrate 104 with a set of circuit chips 102 connected thereto by connections 106. The system 120 includes a heat exchanger 122 which is an alternative embodiment of the heat exchanger 108 of FIG. 9. The heat exchanger 122 comprises a set of fin assemblies 124 each of which is formed of a set of fins 126 and a base 128 which supports the fins 126. Each of the fin assemblies 124 is positioned above a corresponding one of the chips 102, and rests upon a flexible sheet 130 disposed between the fin assemblies 124 and the chips 102. The base 128 of each fin assembly 124 is thermally coupled through the sheet 130 to the corresponding chip 102 by means of a layer 116 of thermally conductive grease. The sheet 130 is formed of thermally conductive material, such as amorphous nickel. Each fin assembly 124 is formed of a thermally conductive material such as copper or silicon.

In the construction of the heat exchangers 108 and 122 of FIGS. 9 and 10, the fins 110 and 124 are constructed first, by selective copper plating, and then the amorphous nickel is deposited on fins to form the exchanger 108, or upon an array of the assemblies 124 to form the exchanger 122. The deposition of the amorphous nickel is accomplished with the aid of a mandrel which holds the fins 110 or 124 in their respective arrays. The nickel is deposited upon the fin assemblies and upon the mandrel by electroless deposition, after which the fin assemblies are removed from the mandrel to complete formation of the heat exchanger 108 or 122. With both the embodiments of FIGS. 9-10, the sheets of the heat exchangers hermetically seal the chips 102. In both embodiments, the bases 114 and 128 rigidly support their respective fins 112 and 126 so as to accommodate short or tall fins as may be required for a particular coolant such as air or water. Also, in both embodiments, the flexibility of the respective sheets 118 or 130 permit the fin assemblies 110 or 124, respectively, to be individually positioned in accordance with the height and orientation of the respective chips 102 relative to the substrate 104. With both embodiments, a coolant is to be delivered by a conduit (not shown) such as that disclosed previously in FIGS. 1 or 8.

The foregoing embodiments of the invention employ the inventive concept of providing a flexible mechanical connection between a heat exchanger and circuit chips so as to enable the supporting structure of a set of cooling fins to make intimate thermal contact with a surface of a chip independently of the orientation and height of the chip relative to both a substrate and the other chips. This concept will be further demonstrated with respect to additional embodiments of the invention to be disclosed in FIGS. 11-14 and 15-17.

With reference to FIGS. 11-14, there is presented a set of steps in the construction of a circuit module 132. The assembly 132 comprises a circuit chip 134 supported by a substrate 136, and cooled by a heat exchanger 138 having a set of fins 140 supported on a base 142. A frame 144 comprises circumferential sidewalls 146 positioned for encircling the substrate 136, and further comprises a flexible sheet 148 supported by the sidewalls 146 and bonded to flanges 150 which are directed inwardly from the tops of the sidewalls 146. The base 142 is bonded to the sheet 148 and, upon a joining of the frame 144 to the substrate 136, is sufficiently flexible to extend downward to the top surface to the chip 134 for alignment of the base 142 with the chip 134.

The sheet 148 is fabricated of a thermally conductive material such as copper, and contacts both the chip 134 and the base 142 to provide for the conduction of heat from the chip 134 to the heat exchanger 138. By way of example in the construction of the heat exchanger 138, the fins 140 may be formed as a square array of pins wherein each pin has a diameter of 93 mils and a height of 1.25 inches. The base 142 is approximately 90 mils thick and has a central stud portion which extends downward an additional 90 mils. The base 142 and the fins 140 upstanding therefrom are formed as an integral assembly of a thermally conductive material such as copper.

Figure 11:
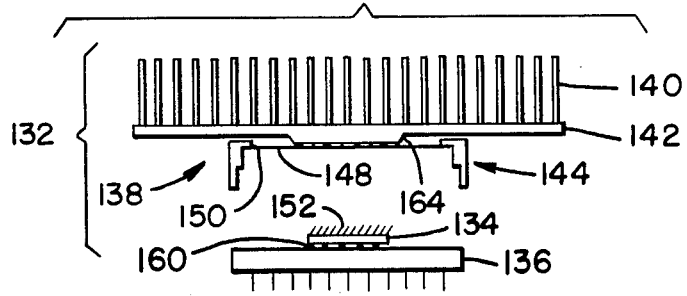
FIGS. 11–14 show steps in the construction of a further embodiment of the invention wherein a base and fin assembly make contact with a flexible sheet held by a frame above a circuit chip.
Figure 12:
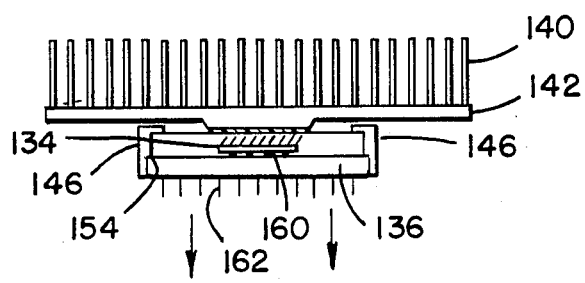
Figure 13:
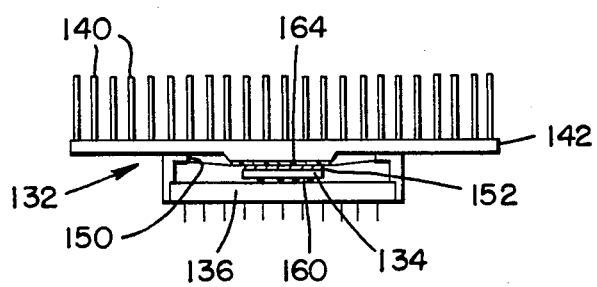
Figure 14:
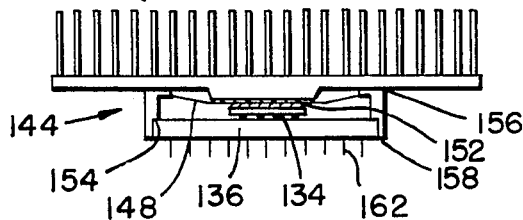

The construction begins, as shown in FIG. 11, by positioning the heat exchanger 138 with the frame 144 and the sheet 148 attached thereto above the substrate 136 and the chip 134 thereon. A layer 152 of thermally enhanced grease is applied to the top surface of the chip 134, and then the frame 144 is lowered to loosely contact the peripheral portions of the substrate 136, as shown in FIG. 12. The substrate 136 sets within shoulders 154 formed within the sidewalls 146. In FIG. 13, the heat exchanger 138 is lowered still further, by flexing of the sheet 148, and squeezing the grease to contact the chip 134. The layer 152 of grease between the sheet 148 and the chip 134 provides for thermal conduction therebetween upon a pressing of the base 142 against the sheet 148 and the chip 134. Finally, as shwon in FIG. 14, the base 142 is bonded at 156 to the tops of the sidewalls 146 to rigidly secure the heat exchanger 138 in position relative to the chip 134. Bottom skirt portions of the sidewalls 146 may also be bonded at 158 to the substrate 136 to hermetically seal the chip 134.

While only one chip 134 is shown in the circuit module assembly 132, it is understood that the circuit module 132 may include plural chips, each of which is connected by C4 solder-ball connections 160 to conductors (not shown) within the substrate 136, thereby to function in the manner of the system 20 of FIG. 1. Pins 162 extending downward from the substrate 136 permit connection with other modules (not shown) of the circuit assembly. The heat exchanger should be divided into plural segments to closely contact each of a plurality of chips. Separate heat exchangers (not shown) would then be mounted on the sheet 148 with the respective stud portions of the bases being positioned in registration with the corresponding chips, and bonded to the sheet 148 with a thermal solder bonds such as a thermal solder bond 164 shown for the assembly 132 in FIG. 11.

Figure 15:
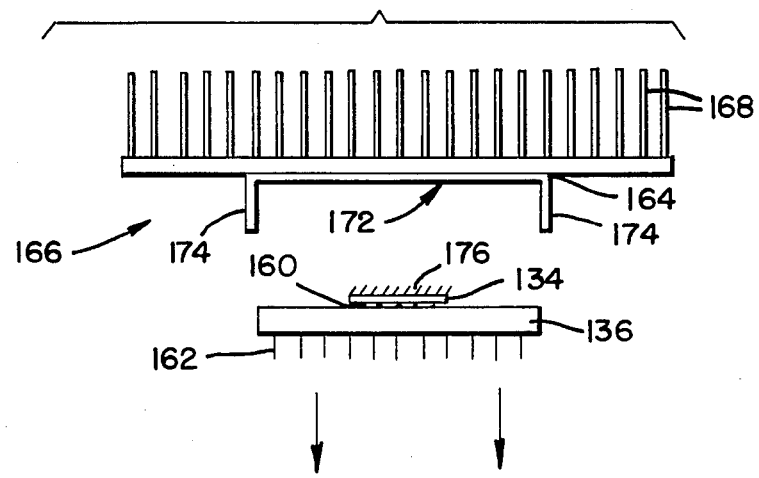
FIGS. 15–17 show steps in the construction of an alternative embodiment of the invention wherein a base and fin assembly make contact via a thermally conductive grease held by a frame upon a circuit chip.
Figure 16:
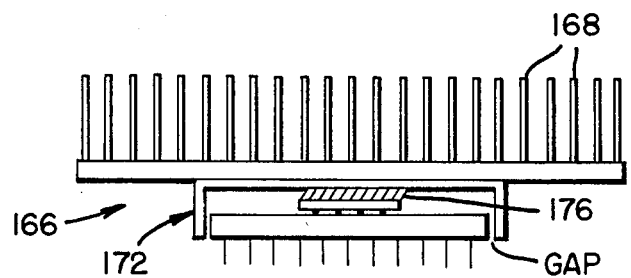
Figure 17:
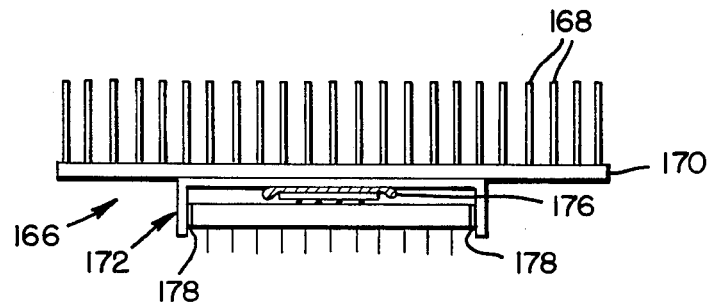

FIGS. 15-17 also show the chip 134 supported by the solder ball connections 160 upon the substrate 136, as shown above in FIGS. 11-14. Cooling is provided by a heat exchanger 166 comprising a set of fins 168 upstanding from a base 170, the base 170 being secured to a cap-shaped frame 172 having sidewalls 174 positioned for enveloping the periphery of the substrate 136. Connection of the heat exchanger 166 to the circuit chip 134 for removal of heat therefrom begins, as shown in FIG. 15, by positioning the frame 172 above the chip 134 and in loose registration with the substrate 136. A thick layer 176 of a thermally conductive grease is placed on top surface of the chip 134. Then, as shown in FIG. 16, the heat exchanger 166 is lowered to bring the sidewalls 174 alongside the peripheral portions of the substrate 136. During the step of lowering the heat exchanger 166, the grease of the layer 176 is extruded between the bottom surface of the frame 172 and the top surface of the chip 134.

The sidewalls 174 make a loose fit to the substrate 136 so as to enable an alignment of the frame 172 with the chip 134 to ensure good thermal contact therewith. Thus, it is appreciated that the initial connection between the heat exchanger 166 and the chip 134 is by a flexible mechanical connection provided by the grease layer 176 and the loose fit between the sidewalls 174 and the substrate 136. After alignment of the heat exchanger 166 is completed, the connection of the heat exchanger 166 to the chip 134 and the substrate 136 is completed, as shown in FIG. 17 by placing an adhesive 178 in the gap between the sidewalls 174 and the substrate 136 to hermetically bond and rigidly secure the sidewalls 174 to the substrate 136, so as to maintain the alignment and thermal conductivity.

It is noted that the foregoing methods of construction provide the good thermal bonding associated with a custom fitting of a heat exchanger to a circuit chip. Such custom fitting is accomplished as follows. First, connect the chip to a beam lead frame, chip carrier or similar support. Second, attach a fin to the chip by a flexible joint, such as thermally loaded silicone or grease. Third, pour plastic around the chip and the fin base. Depending on the rigidity of the plastic, and on the jolts received by the fin, it might be desirable to mechanically protect the chip with a spacer. In some cases it may be desirable to assemble the fin later. First, attach the chip to its carrier. Second, attach a thermal stud to the chip by a flexible joint. Third, pour plastic around the chip and the base of the stud. Fourth, attach the fin to the outside of the stud. For example, use a good thermal bond such as a low melting alloy. Such a procedure maintains the fin or heat exchanger in secure thermal contact with the chip.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

Having thus described our invention, what we claim as new, and desire to secure by Letters Patent is:

1. A heat exchanger for transferring heat from an array of electric circuit chips to a fluid coolant comprising:
   a flexible sheet of thermally conductive material sufficiently large to cover the array of chips and sufficiently flexible to conform to individual orientations of the chips to make thermal contact therewith; and
   a set of thermally conductive fins upstanding from said sheet, said fins being integrally formed with said sheet to permit alignment of said heat exchanger upon said circuit chips such that said fins are oriented in the direction of desired flow of coolant for guiding the coolant among the fins for extraction of heat therefrom.

2. A heat exchanger according to claim 1 wherein said sheet is provided with corrugations between sites of said chips to increase flexibility of said sheet while retaining adhering thermal contact between said sheet and each of said chips.

3. A heat exchanger according to claim 2 wherein the thickness of one of said fins is approximately equal to a spacing between successive fins.

4. A heat exchanger according to claim 3 wherein the thickness of one of said fins is approximately equal to the thickness of said sheet.

5. A heat exchanger according to claim 4 wherein said sheet and said fins are formed of metal.

6. A heat exchanger according to claim 5 wherein said metal is copper.

7. A heat exchanger according to claim 5 wherein said metal is coated with a thermally conductive coating impervious to the coolant.

8. A heat exchanger according to claim 5 wherein said sheet and said fins are formed of copper coated with nickel.

9. A heat exchanger according to claim 1 wherein the positions of said fins are staggered to promote a uniform flow of coolant among the fins.

10. A heat exchanger according to claim 9 wherein the height of a fin is larger than its thickness by a factor in the range of approximately five to ten.

11. A heat exchanger according to claim 1 further comprising means extending over a plurality of said fins for pressing said heat exchanger against said chips.

12. A heat exchanger in accordance with claim 1 wherein:
said fins are comprised of metallic structure means provided to channel fluid and to conduct heat,
said metallic structure means being fabricated by a process employing masking techniques and additive and subtractive techniques for shaping said metallic structure means.

13. A heat exchanger according to claim 12 wherein:
said heat exchanger is coated with a thermally conductive coating inert to a coolant.

14. A heat exchanger in accordance with claim 1 wherein:
said fins are comprised of metallic structure means provided to channel fluid and to conduct heat;
said metallic structure means being fabricated by a process employing masking techniques and subtractive techniques for shaping said metallic structure means.

15. A heat exchanger according to claim 14 wherein:
said heat exchanger is coated with a thermally conductive coating inert to a coolant.

16. A heat exchanger in accordance with claim 1 wherein:
said fins are comprised of metallic structure means provided to channel fluid and to conduct heat,
said metallic structure means being fabricated by a process employing masking techniques and additive techniques for shaping said metallic structure means.

17. A heat exchanger according to claim 16 wherein:
said heat exchanger is coated with a thermally conductive coating inert to a coolant.

* * * * *